United States Patent
Tsutsumi et al.

(10) Patent No.: US 11,283,455 B2
(45) Date of Patent: Mar. 22, 2022

(54) LOCK DETECTION CIRCUIT AND PHASE-LOCKED LOOP CIRCUIT

(71) Applicant: MITSUBISHI ELECTRIC CORPORATION, Tokyo (JP)

(72) Inventors: Koji Tsutsumi, Tokyo (JP); Sho Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/210,923

(22) Filed: Mar. 24, 2021

(65) Prior Publication Data
US 2021/0211134 A1 Jul. 8, 2021

Related U.S. Application Data

(63) Continuation of application No. PCT/JP2018/042815, filed on Nov. 20, 2018.

(51) Int. Cl.
*H03L 7/095* (2006.01)
*H03L 7/089* (2006.01)
*H03L 7/099* (2006.01)

(52) U.S. Cl.
CPC .......... *H03L 7/095* (2013.01); *H03L 7/0893* (2013.01); *H03L 7/0992* (2013.01)

(58) Field of Classification Search
CPC ...... H03L 7/095; H03L 7/0893; H03L 7/0992
USPC ........................................ 327/156, 158, 161
See application file for complete search history.

(56) References Cited

U.S. PATENT DOCUMENTS

| | | | |
|---|---|---|---|
| 2004/0232995 A1* | 11/2004 | Thomsen | H03L 1/022 331/2 |
| 2004/0232997 A1* | 11/2004 | Hein | H03L 1/022 331/16 |
| 2010/0171535 A1* | 7/2010 | Shanan | H03L 7/1976 327/157 |
| 2017/0366192 A1* | 12/2017 | Moehlmann | H03L 7/095 |

OTHER PUBLICATIONS

Forbes et al., "Lock Detect on the ADF4xxx Family of PLL Synthesizers", Analog Devices, 2006, Application Note, AN-873, pp. 1-8.

* cited by examiner

*Primary Examiner* — John W Poos
(74) *Attorney, Agent, or Firm* — Birch, Stewart, Kolasch & Birch, LLP

(57) ABSTRACT

A lock detection circuit is configured to include an integrating circuit that integrates a phase difference between a frequency-divided signal of a VCO and a reference signal during a constant period within a transient response period for an output signal from the VCO, and integrates a phase difference between the frequency-divided signal and the reference signal during a constant period within a convergence period for the output signal from the VCO; and a degree-of-convergence calculating circuit that calculates a degree at which the output signal from the VCO has converged, from a result of the integration of the phase difference obtained by the integrating circuit during the constant period within the transient response period and a result of the integration of the phase difference obtained by the integrating circuit during the constant period within the convergence period.

9 Claims, 11 Drawing Sheets

LOCK DETECTION CIRCUIT AND PHASE-LOCKED LOOP CIRCUIT

CROSS REFERENCE TO RELATED APPLICATIONS

This application is a Continuation of PCT International Application No. PCT/JP2018/042815, filed on Nov. 20, 2018, which is hereby expressly incorporated by reference into the present application.

TECHNICAL FIELD

The invention relates to a lock detection circuit that calculates a degree at which an output signal from a phase-locked loop circuit has converged, and a phase-locked loop circuit that calculates a degree at which an output signal from a voltage-controlled oscillator has converged.

BACKGROUND ART

A phase-locked loop circuit (hereinafter, referred to as "PLL circuit") includes a reference signal source that outputs a reference signal; and a phase comparator that outputs a phase difference between the reference signal outputted from the reference signal source and a frequency-divided signal outputted from a variable frequency divider which will be described later.

In addition, the PLL circuit includes a voltage-controlled oscillator whose output signal frequency changes in accordance with the phase difference outputted from the phase comparator; and a variable frequency divider that divides the frequency of the output signal from the voltage-controlled oscillator and outputs the frequency-divided output signal as a frequency-divided signal to the phase comparator.

The PLL circuit can change the frequency of the output signal from the voltage-controlled oscillator by changing a division ratio of the output signal from the variable frequency divider.

As one performance index of the PLL circuit, there is convergence time. The convergence time is time required for the frequency of an output signal to be stabilized when the frequency of the output signal is abruptly changed.

The following Non-Patent Literature 1 discloses a lock detection circuit that determines that an output signal has converged when a phase difference between a reference signal and a frequency-divided signal is less than or equal to a threshold value.

CITATION LIST

Non-Patent Literature

Non-Patent Literature 1: "Lock Detect on the ADF4xxx Family of PLL Synthesizers" by Peadar Forbes and Ian Collins, Analog Devices, Inc., AN-873 Application Note

SUMMARY OF INVENTION

Technical Problem

The lock detection circuit disclosed in Non-Patent Literature 1 determines that an output signal has converged when a phase difference between a reference signal and a frequency-divided signal is less than or equal to a threshold value. However, for the phase difference, when the frequency of the output signal is abruptly changed by changing a division ratio of the output signal, a damped oscillation occurs during a period from the abrupt change to stabilization. Thus, there is a problem that the extent to which the output signal has converged cannot be calculated only by simply comparing the phase difference with the threshold value.

The invention is made to solve a problem such as that described above, and an object of the invention is to obtain a lock detection circuit and a phase-locked loop circuit that can calculate a degree at which an output signal has converged.

Solution to Problem

A lock detection circuit according to the invention includes an integrating circuit to integrate a phase difference between a frequency-divided signal and a reference signal in a phase-locked loop circuit during a constant period within a transient response period for an output signal from the phase-locked loop circuit, and to integrate a phase difference between the frequency-divided signal and the reference signal during a constant period within a convergence period for the output signal from the phase-locked loop circuit; and a degree-of-convergence calculating circuit to calculate a degree at which the output signal from the phase-locked loop circuit has converged, from a result of the integration of the phase difference obtained by the integrating circuit during the constant period within the transient response period and a result of the integration of the phase difference obtained by the integrating circuit during the constant period within the convergence period.

Advantageous Effects of Invention

According to the invention, the lock detection circuit is configured in such a manner that the degree-of-convergence calculating circuit calculates a degree at which an output signal from the phase-locked loop circuit has converged, from a result of integration of a phase difference obtained by the integrating circuit during a constant period within a transient response period and a result of integration of a phase difference obtained by the integrating circuit during a constant period within a convergence period. Thus, the lock detection circuit according to the invention can calculate a degree at which an output signal from the phase-locked loop circuit has converged.

DESCRIPTION OF EMBODIMENTS

To describe the invention in more detail, embodiments for carrying out the invention will be described below by referring to the accompanying drawings.

First Embodiment

Figure 1:
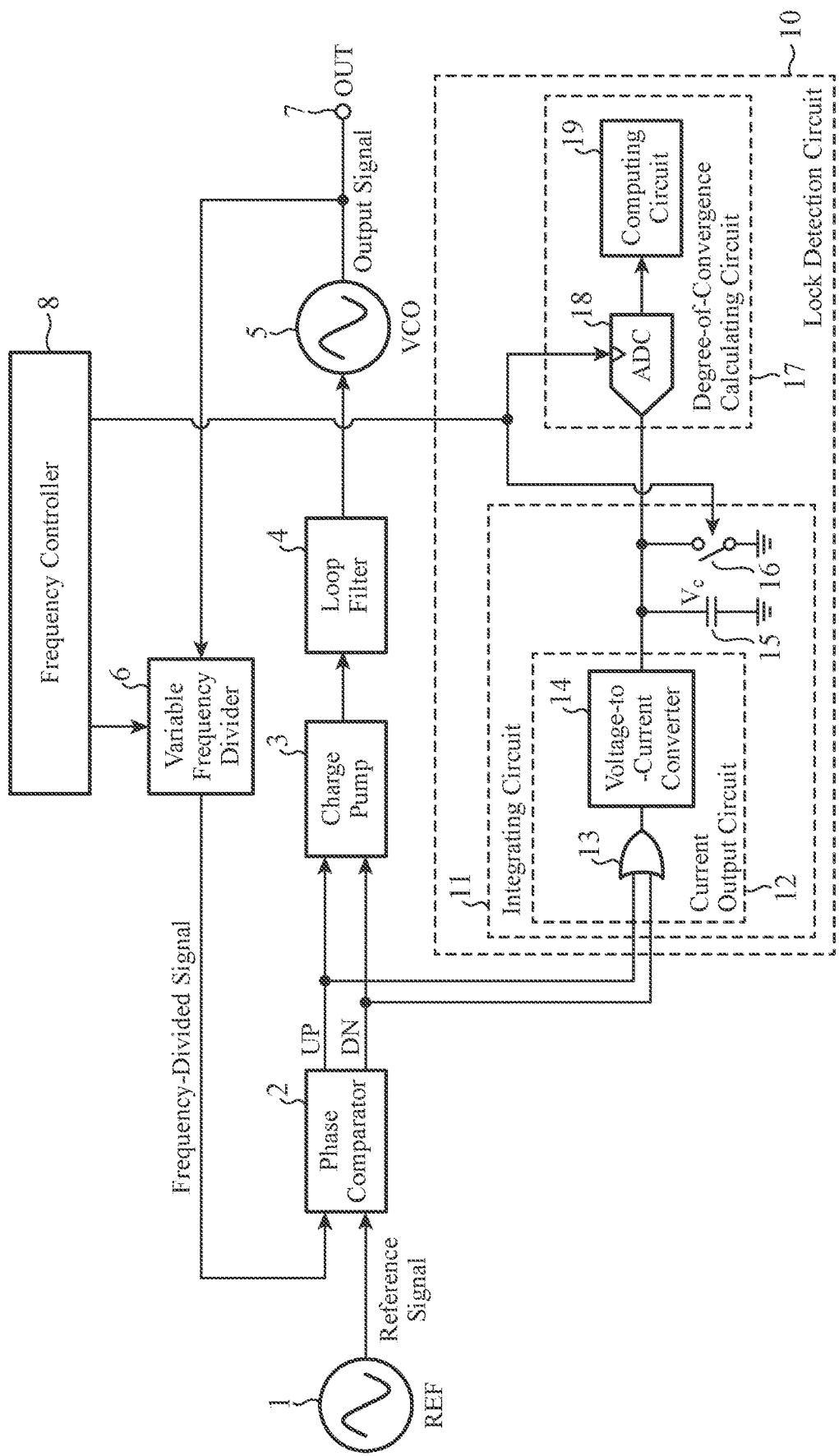
FIG. 1 is a configuration diagram showing a phase-locked loop circuit according to a first embodiment.

FIG. 1 is a configuration diagram showing a phase-locked loop circuit (hereinafter, referred to as "PLL circuit") according to a first embodiment.

In FIG. 1, a reference signal source 1 outputs a reference signal with a constant frequency to a phase comparator 2.

The phase comparator 2 compares the phase of the reference signal outputted from the reference signal source 1 with the phase of a frequency-divided signal outputted from a variable frequency divider 6.

When the phase of the frequency-divided signal is advanced over the phase of the reference signal, the phase comparator 2 outputs a phase error signal UP indicating a phase difference between the reference signal and the frequency-divided signal to each of a charge pump 3 and an OR circuit 13.

When the phase of the frequency-divided signal is delayed over the phase of the reference signal, the phase comparator 2 outputs a phase error signal DN indicating a phase difference between the reference signal and the frequency-divided signal to each of the charge pump 3 and the OR circuit 13.

Each of the phase error signal UP and the phase error signal DN is a voltage signal.

When the phase error signal UP is outputted from the phase comparator 2, the charge pump 3 outputs a positive pulse current with a wider pulse width as a phase difference indicated by the phase error signal UP is greater, to a loop filter 4.

When the phase error signal DN is outputted from the phase comparator 2, the charge pump 3 outputs a negative pulse current with a wider pulse width as a phase difference indicated by the phase error signal DN is greater, to the loop filter 4.

When both the phase error signal UP and the phase error signal DN are not outputted from the phase comparator 2, the charge pump 3 does not output a pulse current to the loop filter 4.

The loop filter 4 converts the pulse current outputted from the charge pump 3 into a voltage, smooths the voltage, and outputs the smoothed voltage to a voltage-controlled oscillator (hereinafter, referred to as "VCO") 5.

The VCO 5 outputs an output signal with a frequency corresponding to the voltage outputted from the loop filter 4 to each of the variable frequency divider 6 and an output terminal 7. The output signal from the VCO 5 is an output signal from the PLL circuit.

The variable frequency divider 6 divides the frequency of the output signal from the VCO 5 by a division ratio indicated by a control signal outputted from a frequency controller 8, and outputs the frequency-divided output signal as a frequency-divided signal to the phase comparator 2.

The output terminal 7 is a terminal for outputting the output signal from the VCO 5 to an external source.

The frequency controller 8 outputs a control signal indicating a division ratio of the output signal to the variable frequency divider 6.

In addition, the frequency controller 8 outputs a control signal that instructs to turn on or off to a reset switch 16, and outputs a control signal that instructs to sample the amount of charge to an analog-to-digital converter (hereinafter, referred to as "ADC") 18.

A lock detection circuit 10 includes an integrating circuit 11 and a degree-of-convergence calculating circuit 17.

The integrating circuit 11 includes a current output circuit 12, a capacitor 15, and the reset switch 16.

The integrating circuit 11 integrates a phase difference indicated by a phase error signal UP outputted from the phase comparator 2 or a phase difference indicated by a phase error signal DN outputted from the phase comparator 2, during a constant period within a transient response period for the output signal from the VCO 5. The integrating circuit 11 outputs a result of the integration of the phase difference as a first integration result to the degree-of-convergence calculating circuit 17. The transient response period is a period during which the frequency of the output signal has a damped oscillation and the frequency of the output signal is shifted from a desired frequency.

In addition, the integrating circuit 11 integrates a phase difference indicated by a phase error signal UP outputted from the phase comparator 2 or a phase difference indicated by a phase error signal DN outputted from the phase comparator 2, during a constant period within a convergence period for the output signal from the VCO 5. The integrating circuit 11 outputs a result of the integration of the phase difference as a second integration result to the degree-of-convergence calculating circuit 17. The convergence period is a period during which the frequency of the output signal substantially matches the desired frequency.

The current output circuit 12 includes the OR circuit 13 and a voltage-to-current converter 14.

The current output circuit 12 outputs to the ADC 18 a current corresponding to the phase difference indicated by the phase error signal UP outputted from the phase comparator 2 or the phase difference indicated by the phase error signal DN outputted from the phase comparator 2.

When the phase error signal UP is outputted from the phase comparator 2, the OR circuit 13 outputs the phase error signal UP to the voltage-to-current converter 14, and when the phase error signal DN is outputted from the phase comparator 2, the OR circuit 13 outputs the phase error signal DN to the voltage-to-current converter 14.

When the voltage-to-current converter 14 receives the phase error signal UP from the OR circuit 13, the voltage-to-current converter 14 converts the phase error signal UP into a current.

When the voltage-to-current converter 14 receives the phase error signal DN from the OR circuit 13, the voltage-to-current converter 14 converts the phase error signal DN into a current.

The capacitor 15 charges, as an integral of the phase difference, electric charges in accordance with the current outputted from the voltage-to-current converter 14, during the constant period within the transient response period.

The capacitor 15 charges, as an integral of the phase difference, electric charges in accordance with the current outputted from the voltage-to-current converter 14, during the constant period within the convergence period.

The reset switch 16 is turned on when the control signal outputted from the frequency controller 8 instructs to "turn on", and is turned off when the control signal outputted from the frequency controller 8 instructs to "turn off".

The degree-of-convergence calculating circuit 17 includes the ADC 18 and a computing circuit 19.

The degree-of-convergence calculating circuit 17 calculates a degree at which the output signal from the VCO 5 has converged (hereinafter, referred to as "degree of convergence") from the first integration result and second integration result outputted from the integrating circuit 11.

When the ADC 18 receives a control signal that instructs to sample the amount of charge from the frequency controller 8, during the transient response period, the ADC 18 samples a voltage applied to the capacitor 15, as a voltage corresponding to the amount of charge of electric charges charged during the constant period within the transient response period.

The ADC 18 converts an analog value indicating the sampled voltage into a digital value (hereinafter, referred to as "first digital value") and outputs the first digital value to the computing circuit 19.

When the ADC 18 receives a control signal that instructs to sample the amount of charge from the frequency controller 8, during the convergence period, the ADC 18 samples a voltage applied to the capacitor 15, as a voltage corresponding to the amount of charge of electric charges charged during the constant period within the convergence period.

The ADC 18 converts an analog value indicating the sampled voltage into a digital value (hereinafter, referred to as "second digital value") and outputs the second digital value to the computing circuit 19.

The computing circuit 19 calculates a difference between the first digital value and the second digital value outputted from the ADC 18, as the degree of convergence of the output signal from the VCO 5. Alternatively, the computing circuit 19 calculates a ratio between the first digital value and the second digital value outputted from the ADC 18, as the degree of convergence of the output signal from the VCO 5.

Next, the operation of the PLL circuit shown in FIG. 1 will be described.

Here, an example in which the PLL circuit generates an output signal whose frequency changes in a sawtooth wave fashion will be described.

Figure 2:
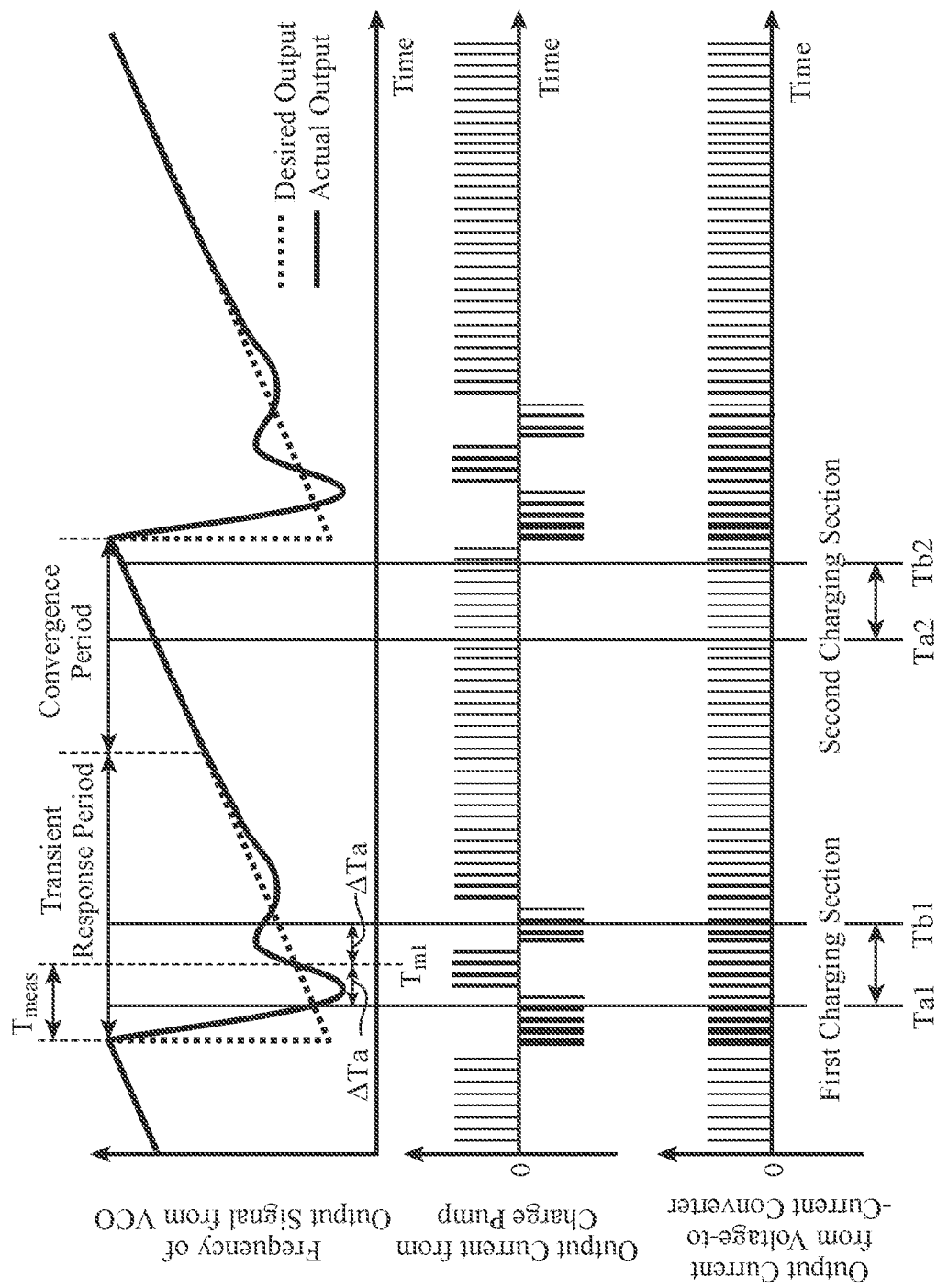
FIG. 2 is an explanatory diagram showing the frequency of an output signal from a VCO 5, a current outputted from a charge pump 3, and a current outputted from a voltage-to-current converter 14.

FIG. 2 is an explanatory diagram showing the frequency of an output signal from the VCO 5, a current outputted from the charge pump 3, and a current outputted from the voltage-to-current converter 14.

The frequency controller 8 controls the division ratio of an output signal from the VCO 5 in such a manner that the frequency of the output signal changes in a sawtooth wave fashion as represented by a dotted line of FIG. 2.

When the frequency of the output signal from the VCO 5 is gradually increased by the frequency controller 8, a change in division ratio caused by control of the frequency controller 8 is small. When the change in division ratio controlled by the frequency controller 8 is small, the frequency of the output signal changes so as to follow the change in division ratio.

When the frequency of the output signal from the VCO 5 is abruptly reduced by the frequency controller 8, a change in division ratio caused by control of the frequency controller 8 is great. When the change in division ratio controlled by the frequency controller 8 is great, the frequency of the output signal cannot follow the change in division ratio, and thus, a damped oscillation occurs.

Thus, the actual frequency of the output signal from the VCO 5 has a waveform represented by a solid line of FIG. 2.

The PLL circuit shown in FIG. 1 includes the lock detection circuit 10 that can calculate the degree of convergence of an output signal from the VCO 5 at time point $T_{m1}$ at which time $T_{meas}$ has elapsed from a time point at which the frequency of the output signal has started to abruptly decrease.

First, the reference signal source 1 outputs a reference signal with a constant frequency to the phase comparator 2.

When the phase comparator 2 receives the reference signal from the reference signal source 1, the phase comparator 2 compares the phase of the reference signal with the phase of a frequency-divided signal outputted from the variable frequency divider 6.

When the phase of the frequency-divided signal is advanced over the phase of the reference signal, the phase comparator 2 outputs a phase error signal UP indicating a phase difference between the reference signal and the frequency-divided signal to each of the charge pump 3 and the OR circuit 13.

When the phase of the frequency-divided signal is delayed over the phase of the reference signal, the phase comparator 2 outputs a phase error signal DN indicating a phase difference between the reference signal and the frequency-divided signal to each of the charge pump 3 and the OR circuit 13.

For the phase difference indicated by the phase error signal UP, the phase of the frequency-divided signal is advanced over the phase of the reference signal, and the phase difference increases as the level of advance in the phase of the frequency-divided signal relative to the reference signal increases.

For the phase difference indicated by the phase error signal DN, the phase of the frequency-divided signal is delayed over the phase of the reference signal, and the phase difference increases as the level of delay in the phase of the frequency-divided signal relative to the reference signal increases.

When the phase error signal UP is outputted from the phase comparator 2, as shown in FIG. 2, the charge pump 3 outputs a positive pulse current to the loop filter 4 so as to increase the frequency of an output signal from the VCO 5.

The charge pump 3 outputs a positive pulse current with a wider pulse width as a phase difference indicated by the phase error signal UP is greater, to the loop filter 4. Thus, when the frequency of the output signal from the VCO 5 is greatly increased, a positive pulse current with a wide pulse width is outputted to the loop filter 4, and when the frequency of the output signal is slightly increased, a positive pulse current with a narrow pulse width is outputted to the loop filter 4. During a convergence period during which the output signal from the VCO 5 has converged, the increase rate of the frequency of the output signal is constant, and thus, a pulse current with a constant pulse width is repeatedly outputted from the charge pump 3.

When the phase error signal DN is outputted from the phase comparator 2, as shown in FIG. 2, the charge pump 3 outputs a negative pulse current to the loop filter 4 so as to reduce the frequency of the output signal from the VCO 5.

The charge pump 3 outputs a negative pulse current with a wider pulse width as a phase difference indicated by the phase error signal DN is greater, to the loop filter 4. Thus, when the frequency of the output signal from the VCO 5 is greatly reduced, a negative pulse current with a wide pulse width is outputted to the loop filter 4, and when the frequency of the output signal is slightly reduced, a negative pulse current with a narrow pulse width is outputted to the loop filter 4.

When the loop filter 4 receives the pulse current from the charge pump 3, the loop filter 4 converts the pulse current into a voltage, smooths the voltage, and outputs the smoothed voltage to the VCO 5.

If the pulse current outputted from the charge pump 3 is a positive pulse current, then the smoothed voltage increases, and if the pulse current outputted from the charge pump 3 is a negative pulse current, then the smoothed voltage decreases.

When the VCO 5 receives the smoothed voltage from the loop filter 4, the VCO 5 outputs an output signal with a frequency corresponding to the smoothed voltage to each of the variable frequency divider 6 and the output terminal 7.

The variable frequency divider 6 divides the frequency of the output signal from the VCO 5 by a division ratio indicated by a control signal outputted from the frequency controller 8, and outputs the frequency-divided output signal as a frequency-divided signal to the phase comparator 2.

When the phase error signal UP is outputted from the phase comparator 2, the OR circuit 13 outputs the phase error signal UP to the voltage-to-current converter 14.

When the phase error signal DN is outputted from the phase comparator 2, the OR circuit 13 outputs the phase error signal DN to the voltage-to-current converter 14.

When the voltage-to-current converter 14 receives the phase error signal UP from the OR circuit 13, the voltage-to-current converter 14 converts the phase error signal UP into a current.

When the voltage-to-current converter 14 receives the phase error signal DN from the OR circuit 13, the voltage-to-current converter 14 converts the phase error signal DN into a current.

To calculate the degree of convergence of the output signal from the VCO 5 at time point $T_{m1}$ at which time $T_{meas}$ has elapsed from a time point at which the frequency of the output signal has started to abruptly decrease, at time Ta1, the frequency controller 8 outputs a control signal that instructs to "turn off" to the reset switch 16.

When the reset switch 16 receives the control signal that instructs to "turn off" from the frequency controller 8, the reset switch 16 is turned off. At a time prior to time Ta1, the reset switch 16 is turned on.

When the reset switch 16 is turned off, the capacitor 15 starts to charge electric charges in accordance with the current outputted from the voltage-to-current converter 14.

At time Tb1, the frequency controller 8 outputs a control signal that instructs to sample the amount of charge to the ADC 18.

Time Ta1 and Tb1 may be stored in an internal memory of the frequency controller 8 or may be provided from an external source.

A period from time Ta1 to time Tb1 (constant period) is within a transient response period. In addition, the length of a period from time Ta1 to time point $T_{m1}$ is the same as the length of a period from time point $T_{m1}$ to time Tb1.

Thus, time Ta1 is a time point earlier by time ΔTa from time point $T_{m1}$, and time Tb1 is a time point later by time ΔTa from time point $T_{m1}$.

For example, if the time $T_{meas}$ is 10 [μs] and ΔTa=1, then time Ta1 is a time point at which a time of 9 [μs] has elapsed from a time point at which the frequency of the output signal has started to abruptly decrease. Time Tb1 is a time point at which a time of 11 [μs] has elapsed from the time point at which the frequency of the output signal has started to abruptly decrease.

When the ADC 18 receives the control signal that instructs to sample the amount of charge from the frequency controller 8, the ADC 18 samples a voltage $V_c$ applied to the capacitor 15. Since the voltage $V_c$ applied to the capacitor 15 is directly proportional to the amount of change of electric charges in the capacitor 15, sampling of the voltage $V_c$ applied to the capacitor 15 corresponds to sampling of the amount of charge of electric charges in the capacitor 15.

The ADC 18 converts an analog value indicating the sampled voltage $V_c$ into a first digital value $V_{adc1}$, and outputs the first digital value $V_{adc1}$ to the computing circuit 19.

After the frequency controller 8 outputs the control signal that instructs to sample the amount of charge to the ADC 18 and before time Ta2, the frequency controller 8 outputs a control signal that instructs to "turn on" to the reset switch 16 so as to reset the capacitor 15.

When the reset switch 16 receives the control signal that instructs to "turn on" from the frequency controller 8, the reset switch 16 is turned on.

When the reset switch 16 is turned on, the capacitor 15 discharges the charged electric charges.

Then, at time Ta2, the frequency controller 8 outputs a control signal that instructs to "turn off" to the reset switch 16.

When the reset switch 16 receives the control signal that instructs to "turn off" from the frequency controller 8, the reset switch 16 is turned off.

When the reset switch 16 is turned off, the capacitor 15 starts to charge electric charges in accordance with a current outputted from the voltage-to-current converter 14.

At time Tb2, the frequency controller 8 outputs a control signal that instructs to sample the amount of charge to the ADC 18.

Time Ta2 and Tb2 may be stored in the internal memory of the frequency controller 8 or may be provided from an external source.

A period from time Ta2 to time Tb2 (constant period) is within a convergence period. In addition, the length of the period from time Ta2 to time Tb2 is the same as the length of the period from time Ta1 to time Tb1.

In the frequency controller 8, a precise convergence period is unknown, but an approximate convergence period can be known upon designing, and thus, the period from time Ta2 to time Tb2 can be set within the convergence period.

When the ADC 18 receives the control signal that instructs to sample the amount of charge from the frequency controller 8, the ADC 18 samples a voltage $V_c$ applied to the capacitor 15.

The ADC 18 converts an analog value indicating the sampled voltage $V_c$ into a second digital value $V_{adc2}$, and outputs the second digital value $V_{adc2}$ to the computing circuit 19.

The computing circuit 19 calculates a difference between the first digital value $V_{adc1}$ and the second digital value $V_{adc2}$ outputted from the ADC 18, as the degree of convergence C of the output signal from the VCO 5, as shown in the following equation (1). The closer C is to 0, the closer the frequency of the output signal from the VCO 5 is to the desired frequency, and thus, the first digital value $V_{adc1}$ in the transient response period is in a state of being close to convergence.

$$C = V_{adc1} - V_{adc2} \qquad (1)$$

Here, the computing circuit 19 calculates a difference between the first digital value $V_{adc1}$ and the second digital value $V_{adc2}$ as the degree of convergence C of the output signal from the VCO 5. However, this configuration is merely an example, and the computing circuit 19 may calculate a ratio between the first digital value $V_{adc1}$ and the second digital value $V_{adc2}$ as the degree of convergence C of the output signal from the VCO 5, as shown in the following equation (2). The closer C is to 1, the closer the frequency of the output signal from the VCO 5 is to the desired frequency, and thus, the first digital value $V_{adc1}$ in the transient response period is in a state of being close to convergence.

$$C = V_{adc1} / V_{adc2} \qquad (2)$$

In the above-described first embodiment, the lock detection circuit 10 is configured to include the integrating circuit 11 that integrates a phase difference between a frequency-divided signal of the VCO 5 and a reference signal during a constant period within a transient response period for an output signal from the VCO 5, and integrates a phase difference between the frequency-divided signal and the reference signal during a constant period within a convergence period for the output signal from the VCO 5; and the degree-of-convergence calculating circuit 17 that calculates a degree at which the output signal from the VCO 5 has converged, from a result of the integration of the phase difference obtained by the integrating circuit 11 during the constant period within the transient response period and a result of the integration of the phase difference obtained by the integrating circuit 11 during the constant period within the convergence period. Thus, the lock detection circuit 10 can calculate a degree at which the output signal from the VCO 5 has converged.

Second Embodiment

The lock detection circuit 10 shown in FIG. 1 includes the integrating circuit 11 that integrates a phase difference between a frequency-divided signal and a reference signal during a constant period within a transient response period for an output signal from the VCO 5, and integrates a phase difference between the frequency-divided signal and the reference signal during a constant period within a convergence period for the output signal from the VCO 5. In addition, the lock detection circuit 10 shown in FIG. 1 includes the degree-of-convergence calculating circuit 17 that calculates the degree of convergence of the output signal from the VCO 5 from a first integration result and a second integration result which are outputted from the integrating circuit 11.

Figure 3:
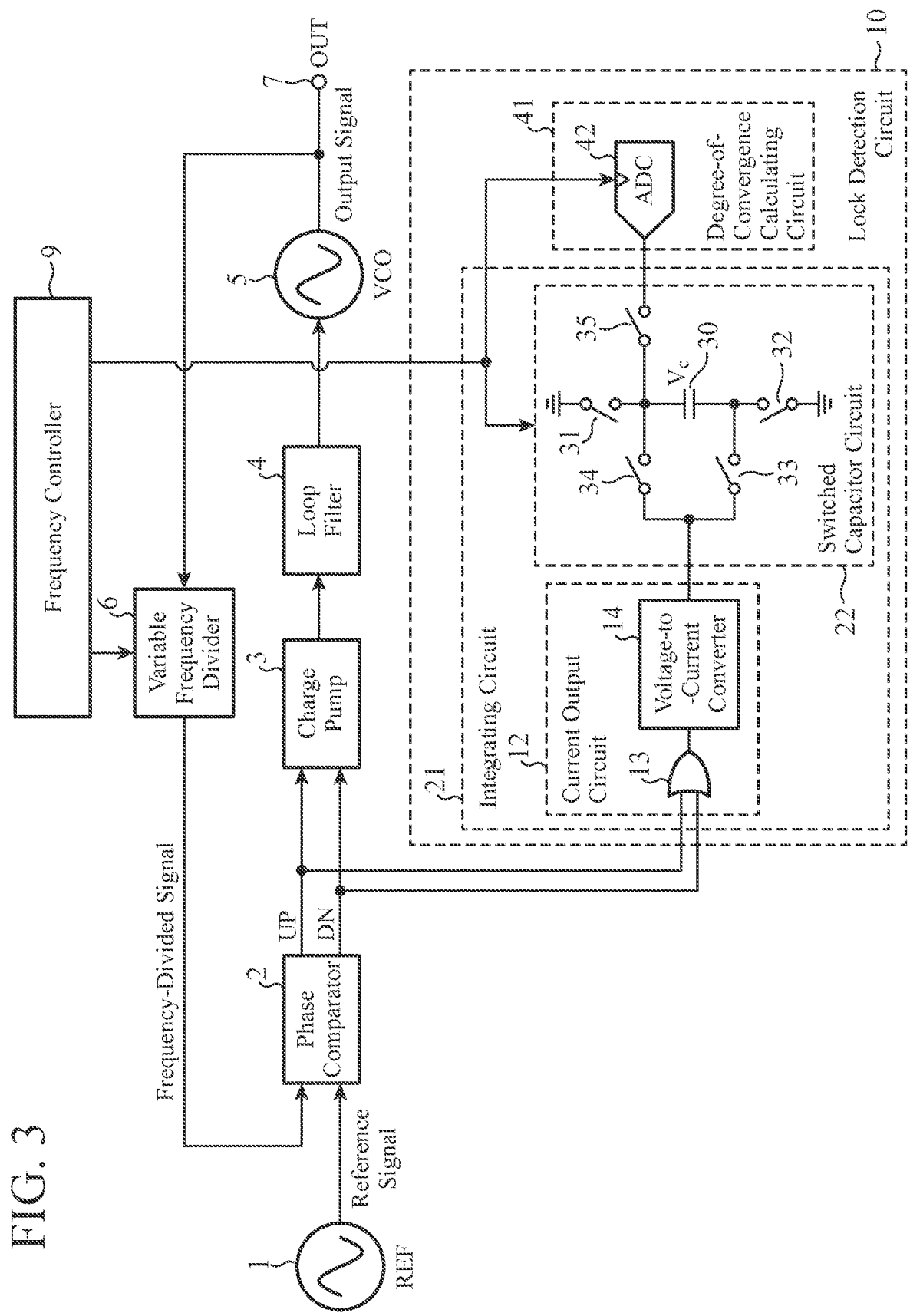
FIG. 3 is a configuration diagram showing a phase-locked loop circuit according to a second embodiment.

As shown in FIG. 3, the lock detection circuit 10 may include: an integrating circuit 21 including a switched capacitor circuit 22; and a degree-of-convergence calculating circuit 41 that determines the amount of charge of electric charges in a capacitor 30 having been charged with electric charges in a negative direction by the switched capacitor circuit 22.

FIG. 3 is a configuration diagram showing a PLL circuit according to a second embodiment. In FIG. 3, the same reference signs as those of FIG. 1 indicate the same or corresponding components and thus description thereof is omitted.

As with the frequency controller 8 shown in FIG. 1, a frequency controller 9 outputs a control signal indicating a division ratio of an output signal from the VCO 5 to the variable frequency divider 6.

The frequency controller 9 outputs a control signal that instructs to turn on or off to switches 31 to 35, and outputs a control signal that instructs to sample the amount of charge to an ADC 42 in the degree-of-convergence calculating circuit 41.

The integrating circuit 21 includes the current output circuit 12 and the switched capacitor circuit 22.

The switched capacitor circuit 22 includes the capacitor 30 and the switches 31 to 35.

The switched capacitor circuit 22 charges electric charges in a positive direction in the capacitor 30 in accordance with a current outputted from the current output circuit 12, during a constant period within a transient response period.

Then, the switched capacitor circuit 22 charges electric charges in a negative direction in the capacitor 30 in accordance with a current outputted from the current output circuit 12, during a constant period within a convergence period.

The capacitor 30 is connected at its one end to one end of the switch 31 and connected at its other end to one end of the switch 32.

The capacitor 30 charges electric charges in a positive direction in accordance with a current outputted from the current output circuit 12, or charges electric charges in a negative direction in accordance with a current outputted from the current output circuit 12. The amount of charge in the capacitor 30 corresponds to a result of integration performed by the integrating circuit 21.

When the switches 31 to 35 receive a control signal that instructs to "turn on" from the frequency controller 9, the switches 31 to 35 are turned on, and when the switches 31 to 35 receive a control signal that instructs to "turn off" from the frequency controller 9, the switches 31 to 35 are turned off.

The switch 31 is connected at its one end to the one end of the capacitor 30 and connected at its other end to ground.

The switch 32 is connected at its one end to the other end of the capacitor 30 and connected at its other end to ground.

The switch 33 is connected at its one end to an output side of the voltage-to-current converter 14 and connected at its other end to the other end of the capacitor 30.

The switch 34 is connected at its one end to the output side of the voltage-to-current converter 14 and connected at its other end to the one end of the capacitor 30.

The switch 35 is connected at its one end to the one end of the capacitor 30 and connected at its other end to an input side of the ADC 42.

The degree-of-convergence calculating circuit 41 includes the ADC 42.

The degree-of-convergence calculating circuit 41 determines the amount of charge in the capacitor 30 having been charged with electric charges in a negative direction by the switched capacitor circuit 22, as the degree of convergence of the output signal from the VCO 5.

When the ADC 42 receives a control signal that instructs to perform sampling from the frequency controller 9, the ADC 42 samples a voltage $V_c$ applied to the capacitor 30, as a voltage corresponding to the amount of charge of electric charges in the capacitor 30.

The ADC 42 converts an analog value indicating the sampled voltage $V_c$ into a digital value $V_{adc3}$. The digital value $V_{adc3}$ indicates the degree of convergence C of the output signal from the VCO 5.

Next, the operation of the PLL circuit shown in FIG. 3 will be described. Note, however, that all components other than the frequency controller 9, the switched capacitor circuit 22, and the degree-of-convergence calculating circuit 41 are the same as those of the PLL circuit shown in FIG. 1, and thus, here, only operations of the frequency controller 9, the switched capacitor circuit 22, and the degree-of-convergence calculating circuit 41 will be described.

Figure 4:
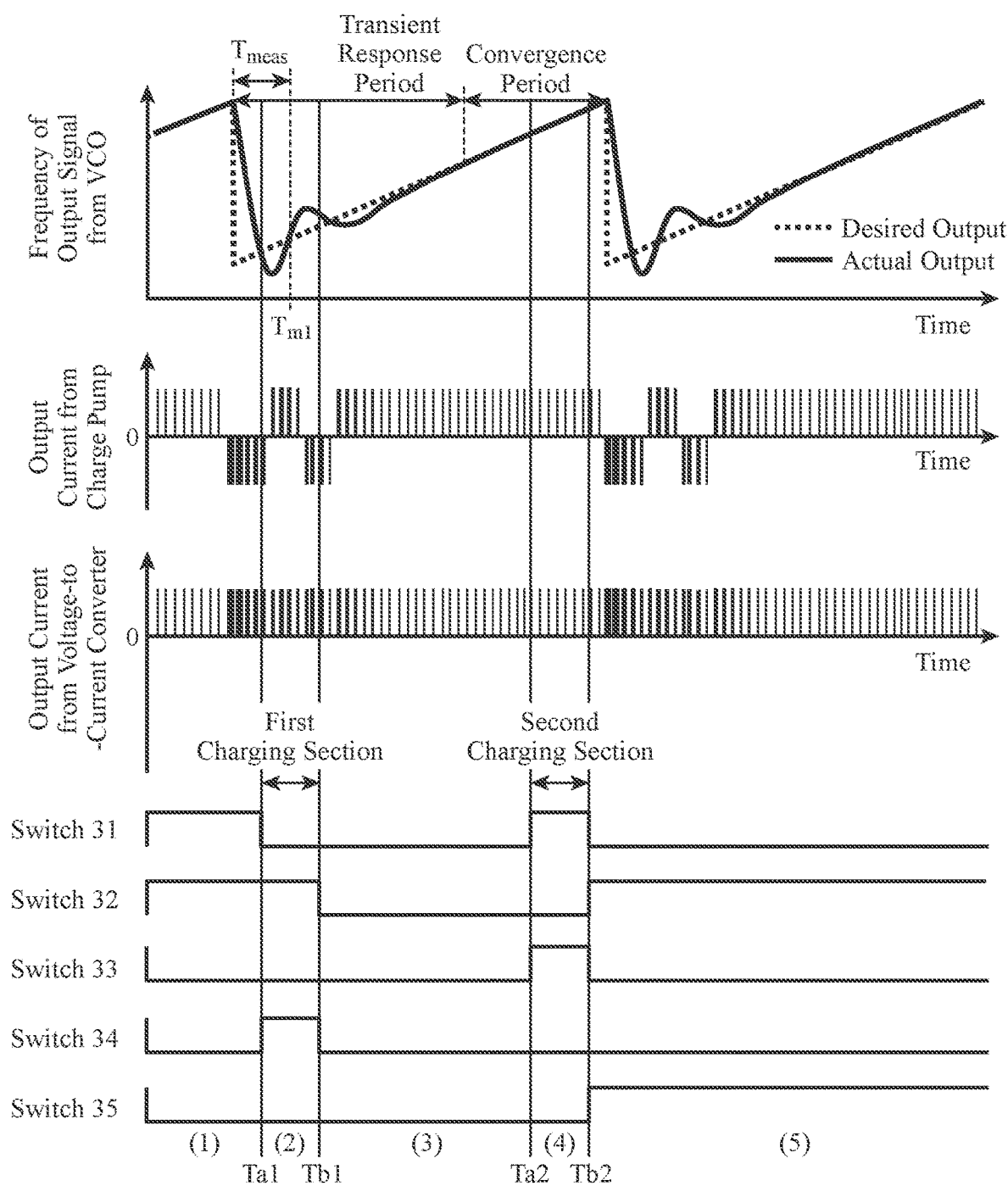
FIG. 4 is an explanatory diagram showing the frequency of an output signal from the VCO 5, a current outputted from the charge pump 3, and a current outputted from the voltage-to-current converter 14.

FIG. 4 is an explanatory diagram showing the frequency of an output signal from the VCO 5, a current outputted from the charge pump 3, and a current outputted from the voltage-to-current converter 14.

Figure 5:
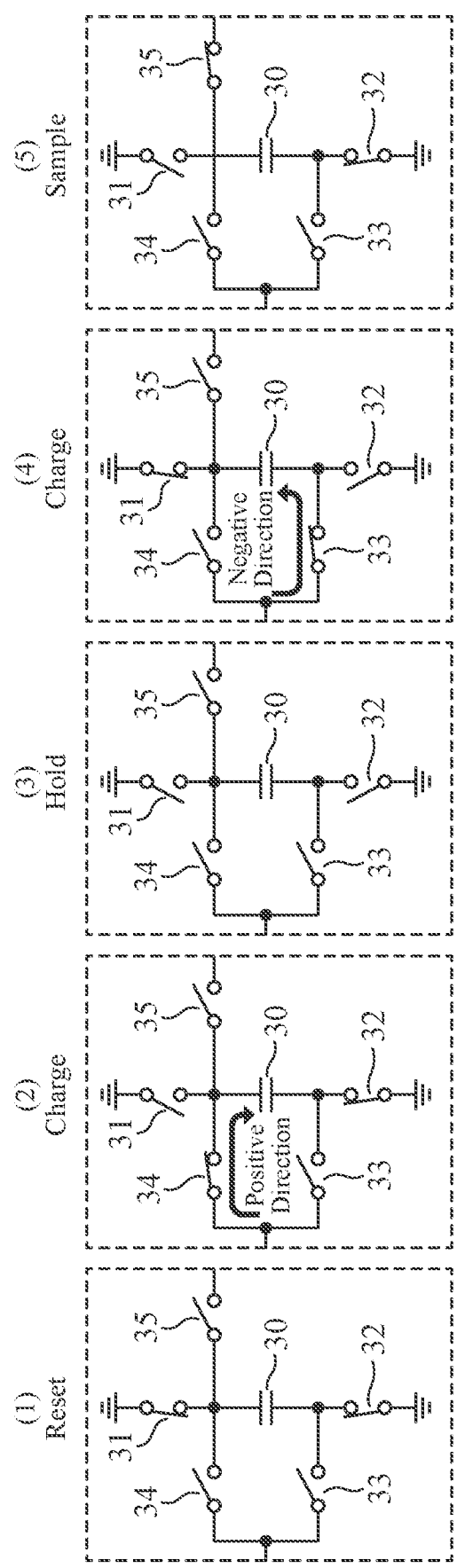
FIG. 5 is an explanatory diagram for describing the operation of a switched capacitor circuit 22.

FIG. 5 is an explanatory diagram for describing the operation of the switched capacitor circuit 22.

The PLL circuit shown in FIG. 3 also calculates the degree of convergence of an output signal from the VCO 5 at time point $T_{m1}$ at which time $T_{meas}$ has elapsed from a time point at which the frequency of the output signal has started to abruptly decrease.

Prior to performing a process of calculating the degree of convergence C, as shown in (1) of FIG. 4, the frequency controller 9 outputs a control signal that instructs to "turn on" to the switches 31 and 32, and outputs a control signal that instructs to "turn off" to the switches 33 to 35.

When the switches 31 and 32 receive the control signal that instructs to "turn on" from the frequency controller 9, the switches 31 and 32 are turned on as shown in (1) of FIG. 5.

When the switches 33 to 35 receive the control signal that instructs to "turn off" from the frequency controller 9, the switches 33 to 35 are turned off as shown in (1) of FIG. 5.

(1) of FIG. 5 shows resetting of the capacitor 30, and electric charges charged in the capacitor 30 are all discharged.

At time Ta1, as shown in (2) of FIG. 4, the frequency controller 9 outputs a control signal that instructs to "turn on" to the switches 32 and 34, and outputs a control signal that instructs to "turn off" to the switches 31, 33, and 35.

When the switches 32 and 34 receive the control signal that instructs to "turn on" from the frequency controller 9, as shown in (2) of FIG. 5, the switches 32 and 34 are turned on.

When the switches 31, 33, and 35 receive the control signal that instructs to "turn off" from the frequency controller 9, as shown in (2) of FIG. 5, the switches 31, 33, and 35 are turned off.

(2) of FIG. 5 shows charging of the capacitor 30 during a transient response period, and the capacitor 30 is charged with electric charges in a positive direction in accordance with a current outputted from the voltage-to-current converter 14.

At time Tb1, as shown in (3) of FIG. 4, the frequency controller 9 outputs a control signal that instructs to "turn off" to the switches 31 to 35.

When the switches 31 to 35 receive the control signal that instructs to "turn off" from the frequency controller 9, as shown in (3) of FIG. 5, the switches 31 to 35 are turned off.

(3) of FIG. 5 shows holding of electric charges charged by the capacitor 30.

At time Ta2, as shown in (4) of FIG. 4, the frequency controller 9 outputs a control signal that instructs to "turn on" to the switches 31 and 33, and outputs a control signal that instructs to "turn off" to the switches 32, 34, and 35.

When the switches 31 and 33 receive the control signal that instructs to "turn on" from the frequency controller 9, as shown in (4) of FIG. 5, the switches 31 and 33 are turned on.

When the switches 32, 34, and 35 receive the control signal that instructs to "turn off" from the frequency controller 9, as shown in (4) of FIG. 5, the switches 32, 34, and 35 are turned off.

(4) of FIG. 5 shows charging of the capacitor 30 during a convergence period, and the capacitor 30 is charged with electric charges in a negative direction in accordance with a current outputted from the voltage-to-current converter 14.

At time Tb2, as shown in (5) of FIG. 4, the frequency controller 9 outputs a control signal that instructs to "turn on" to the switches 32 and 35, and outputs a control signal that instructs to "turn off" to the switches 31, 33, and 34.

In addition, the frequency controller 9 outputs a control signal that instructs to sample the amount of charge to the ADC 42 in the degree-of-convergence calculating circuit 41.

When the switches 32 and 35 receive the control signal that instructs to "turn on" from the frequency controller 9, as shown in (5) of FIG. 5, the switches 32 and 35 are turned on.

When the switches 31, 33, and 34 receive the control signal that instructs to "turn off" from the frequency controller 9, as shown in (5) of FIG. 5, the switches 31, 33, and 34 are turned off.

(5) of FIG. 5 shows that a voltage applied to the capacitor 30 is sampled by the ADC 42.

When the ADC 42 receives the control signal that instructs to sample the amount of charge from the frequency controller 9, the ADC 42 samples a voltage $V_c$ applied to the capacitor 30, as a voltage corresponding to the amount of charge in the capacitor 30.

The ADC 42 converts an analog value indicating the sampled voltage $V_c$ into a digital value $V_{adc3}$. The digital value $V_{adc3}$ indicates the degree of convergence C of the output signal from the VCO 5. The closer C is to 0, the closer the frequency of the output signal from the VCO 5 is to a desired frequency, and thus, the digital value $V_{adc3}$ in the transient response period is in a state of being close to convergence.

In the above-described second embodiment, the lock detection circuit 10 is configured in such a manner that the integrating circuit 21 includes the current output circuit 12 and the switched capacitor circuit 22, and the degree-of-convergence calculating circuit 41 determines the amount of charge of electric charges in the capacitor 30 having been charged with electric charges in a negative direction by the switched capacitor circuit 22, as the degree of convergence of an output signal from the VCO 5. Thus, the lock detection circuit 10 can calculate the degree of convergence of the output signal from the VCO 5.

Third Embodiment

In a third embodiment, a PLL circuit including a convergence time calculating unit 52 that detects convergence time of an output signal from the VCO 5 will be described.

Figure 6:
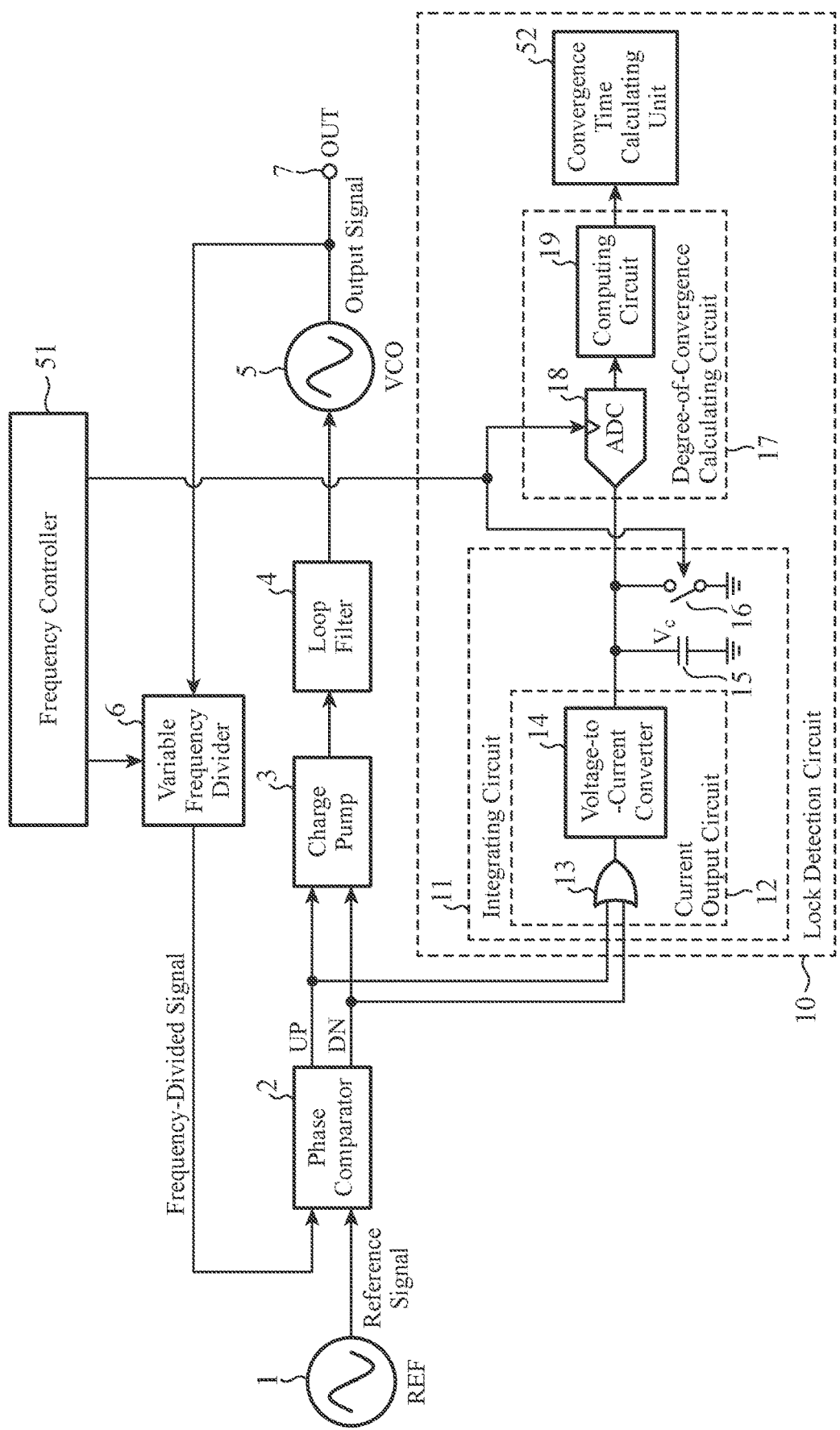
FIG. 6 is a configuration diagram showing a phase-locked loop circuit according to a third embodiment.

FIG. 6 is a configuration diagram showing a PLL circuit according to the third embodiment. In FIG. 6, the same reference signs as those of FIG. 1 indicate the same or corresponding components and thus description thereof is omitted.

As with the frequency controller 8 shown in FIG. 1, a frequency controller 51 outputs a control signal indicating a division ratio of an output signal from the VCO 5 to the variable frequency divider 6.

In addition, as with the frequency controller 8 shown in FIG. 1, the frequency controller 51 outputs a control signal that instructs to turn on or off to the reset switch 16, and outputs a control signal that instructs to sample the amount of charge to the ADC 18.

Note, however, that unlike the frequency controller 8 shown in FIG. 1, the frequency controller 51 allows the integrating circuit 11 to perform each of integration of a phase difference during a constant period within a transient response period and integration of a phase difference during a constant period within a convergence period a plurality of times while switching integration periods for the phase differences.

In addition, the frequency controller 51 allows the degree-of-convergence calculating circuit 17 to calculate each degree of convergence of the output signal from the VCO 5 from each first integration result and each second integration result which are outputted from the integrating circuit 11.

The convergence time calculating unit 52 calculates convergence time of the output signal from the VCO 5 from each degree of convergence calculated by the degree-of-convergence calculating circuit 17.

The PLL circuit shown in FIG. 6 is configured in such a manner that the convergence time calculating unit 52 is added to the PLL circuit shown in FIG. 1 and the frequency controller 51 is used instead of the frequency controller 8. However, no limitation is intended thereto, and the PLL circuit may be configured in such a manner that the convergence time calculating unit 52 is added to the PLL circuit shown in FIG. 3 and the frequency controller 51 is used instead of the frequency controller 9.

Next, the operation of the PLL circuit shown in FIG. 6 will be described.

The PLL circuit shown in FIG. 1 calculates, only once, the degree of convergence C of an output signal from the VCO 5 at time point $T_{m1}$ at which time $T_{meas}$ has elapsed from a time point at which the frequency of the output signal has started to abruptly decrease.

The PLL circuit shown in FIG. 6 calculates each of the degrees of convergence C(1) to C(N) of an output signal at time points $T_{m(1)}$ to $T_{m(N)}$ at which time $T_{meas(1)}$ to $T_{meas(N)}$ have elapsed, respectively, by switching time $T_{meas}$, instead of calculating the degree of convergence C only once.

A specific description is as follows.

Figure 7:
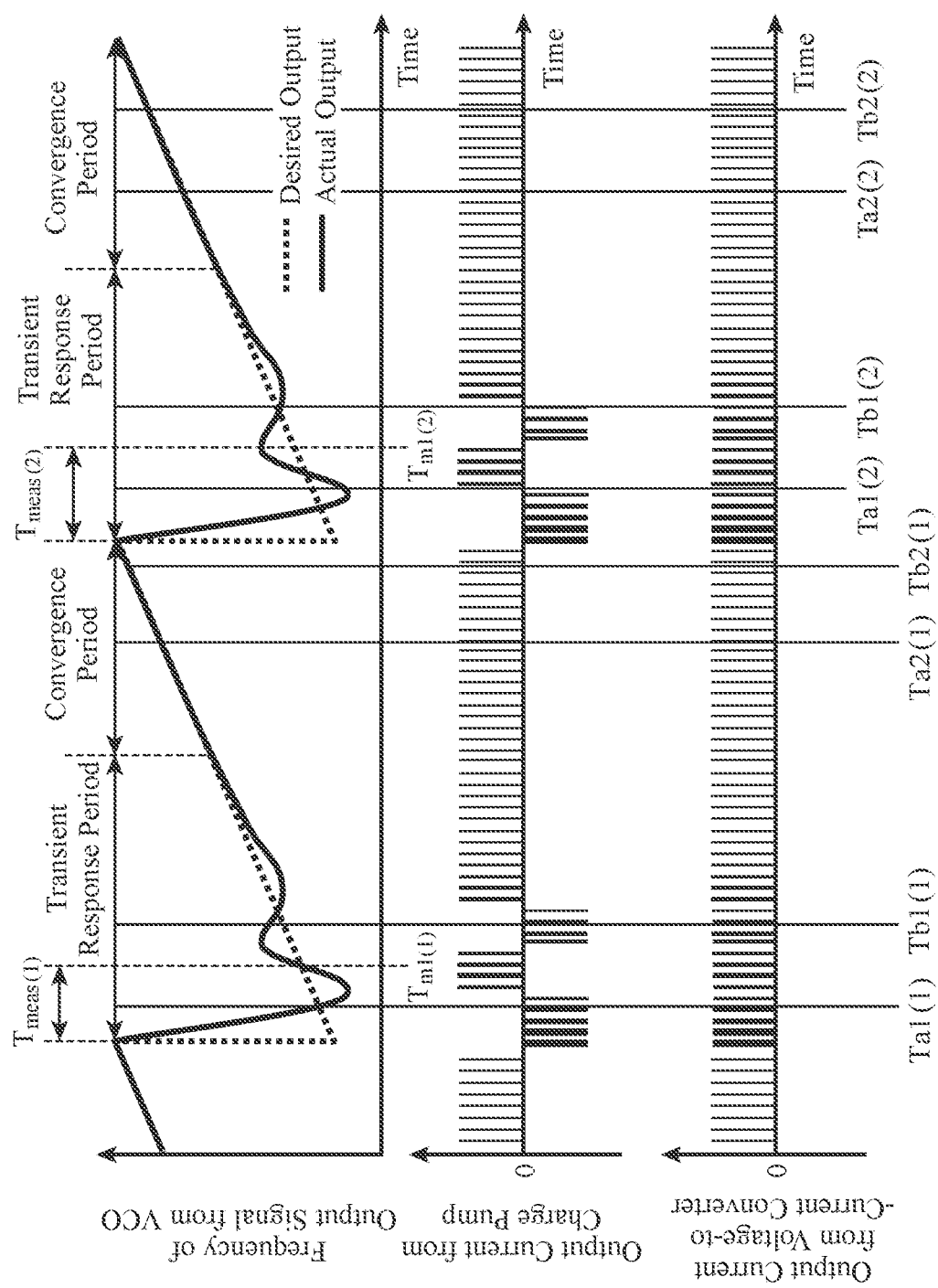
FIG. 7 is an explanatory diagram showing the frequency of an output signal from the VCO 5, a current outputted from the charge pump 3, and a current outputted from the voltage-to-current converter 14.

FIG. 7 is an explanatory diagram showing the frequency of an output signal from the VCO 5, a current outputted from the charge pump 3, and a current outputted from the voltage-to-current converter 14. Note, however, that for simplification of the drawing, FIG. 7 only shows two calculations of the degrees of convergence C(1) and C(2).

At time Ta1(1), the frequency controller 51 outputs a control signal that instructs to "turn off" to the reset switch 16 so as to calculate the degree of convergence of an output signal at time point $T_{m(1)}$ at which time $T_{meas(1)}$ has elapsed from a time point at which the frequency of the output signal has started to abruptly decrease.

When the reset switch 16 receives the control signal that instructs to "turn off" from the frequency controller 51, the reset switch 16 is turned off. At a time prior to time Ta1(1), the reset switch 16 is turned on.

When the reset switch 16 is turned off, the capacitor 15 starts to charge electric charges in accordance with a current outputted from the voltage-to-current converter 14.

At time Tb1(1), the frequency controller 51 outputs a control signal that instructs to sample the amount of charge to the ADC 18.

Time Ta1(1) and Tb1(1) may be stored in an internal memory of the frequency controller 51 or may be provided from an external source.

A period from time Ta1(1) to time Tb1(1) (constant period) is within a transient response period. In addition, the length of a period from time Ta1(1) to time point $T_{m(1)}$ is the same as the length of a period from time point $T_{m(1)}$ to time Tb1(1).

When the ADC 18 receives the control signal that instructs to sample the amount of charge from the frequency controller 51, the ADC 18 samples a voltage $V_c$ applied to the capacitor 15.

The ADC 18 converts an analog value indicating the sampled voltage $V_c$ into a first digital value $V_{adc1(1)}$, and outputs the first digital value $V_{adc1(1)}$ to the computing circuit 19.

After the frequency controller 51 outputs the control signal that instructs to sample the amount of charge to the ADC 18 and before time Ta2(1), the frequency controller 51 outputs a control signal that instructs to "turn on" to the reset switch 16 so as to reset the capacitor 15.

When the reset switch 16 receives the control signal that instructs to "turn on" from the frequency controller 51, the reset switch 16 is turned on.

When the reset switch 16 is turned on, the capacitor 15 discharges the charged electric charges.

Then, at time Ta2(1), the frequency controller 51 outputs a control signal that instructs to "turn off" to the reset switch 16.

When the reset switch 16 receives the control signal that instructs to "turn off" from the frequency controller 51, the reset switch 16 is turned off.

When the reset switch 16 is turned off, the capacitor 15 starts to charge electric charges in accordance with a current outputted from the voltage-to-current converter 14.

At time Tb2(1), the frequency controller 51 outputs a control signal that instructs to sample the amount of charge to the ADC 18.

Time Ta2(1) and Tb2(1) may be stored in the internal memory of the frequency controller 51 or may be provided from an external source.

A period from time Ta2(1) to time Tb2(1) (constant period) is within a convergence period. In addition, the length of the period from time Ta2(1) to time Tb2(1) is the same as the length of the period from time Ta1(1) to time Tb1(1).

In the frequency controller 51, a precise convergence period is unknown, but an approximate convergence period can be known upon designing, and thus, the period from time Ta2(1) to time Tb2(1) can be set within the convergence period.

When the ADC 18 receives the control signal that instructs to sample the amount of charge from the frequency controller 51, the ADC 18 samples a voltage $V_c$ applied to the capacitor 15.

The ADC 18 converts an analog value indicating the sampled voltage $V_c$ into a second digital value $V_{adc2(1)}$, and outputs the second digital value $V_{adc2(1)}$ to the computing circuit 19.

The computing circuit 19 calculates a difference between the first digital value $V_{adc1(1)}$ and second digital value $V_{adc2(1)}$ outputted from the ADC 18, as the degree of convergence C(1) of the output signal from the VCO 5, as shown in the following equation (3):

$$C(1) = V_{adc1(1)} - V_{adc2(1)} \qquad (3)$$

Here, the computing circuit 19 calculates a difference between the first digital value $V_{adc1(1)}$ and the second digital value $V_{adc2(1)}$ as the degree of convergence C(1) of the output signal from the VCO 5. However, this configuration is merely an example, and the computing circuit 19 may calculate a ratio between the first digital value $V_{adc1(1)}$ and the second digital value $V_{adc2(1)}$ as the degree of convergence C(1) of the output signal from the VCO 5, as shown in the following equation (4):

$$C(1) = V_{adc1(1)}/V_{adc2(1)} \qquad (4)$$

After the frequency controller 51 outputs the control signal that instructs to sample the amount of charge to the ADC 18 and before time Ta1(n), the frequency controller 51 outputs a control signal that instructs to "turn on" to the reset switch 16 so as to reset the capacitor 15.

When the reset switch 16 receives the control signal that instructs to "turn on" from the frequency controller 51, the reset switch 16 is turned on.

When the reset switch 16 is turned on, the capacitor 15 discharges the charged electric charges.

Then, at time Ta1(n), the frequency controller 51 outputs a control signal that instructs to "turn off" to the reset switch 16 so as to calculate the degree of convergence of the output signal at time point $T_{m(n)}$ at which time $T_{meas(n)}$ has elapsed from a time point at which the frequency of the output signal has started to abruptly decrease. n=2, 3, ..., N. $T_{meas(1)}$, $T_{meas(2)}$, ..., and $T_{meas(N)}$ are different pieces of time. Thus, integration periods for phase differences for N degrees of convergence C(1) to C(N) differ from each other.

When the reset switch 16 receives the control signal that instructs to "turn off" from the frequency controller 51, the reset switch 16 is turned off.

When the reset switch 16 is turned off, the capacitor 15 starts to charge electric charges in accordance with a current outputted from the voltage-to-current converter 14.

At time Tb1(n), the frequency controller 51 outputs a control signal that instructs to sample the amount of charge to the ADC 18.

Time Ta1(n) and Tb1(n) may be stored in the internal memory of the frequency controller 51 or may be provided from an external source.

A period from time Ta1(n) to time Tb1(n) (constant period) is within a transient response period. In addition, the length of a period from time Ta1(n) to time point $T_{m(n)}$ is the same as the length of a period from time point $T_{m(n)}$ to time Tb1(n).

The length of the period from time Ta1(n) to time Tb1(n) is the same as the length of the period from time Ta1(1) to time Tb1(1).

When the ADC 18 receives the control signal that instructs to sample the amount of charge from the frequency controller 51, the ADC 18 samples a voltage $V_c$ applied to the capacitor 15.

The ADC 18 converts an analog value indicating the sampled voltage $V_c$ into a first digital value $V_{adc1(n)}$, and outputs the first digital value $V_{adc1(n)}$ to the computing circuit 19.

After the frequency controller 51 outputs the control signal that instructs to sample the amount of charge to the ADC 18 and before time Ta2(n), the frequency controller 51 outputs a control signal that instructs to "turn on" to the reset switch 16 so as to reset the capacitor 15.

When the reset switch 16 receives the control signal that instructs to "turn on" from the frequency controller 51, the reset switch 16 is turned on.

When the reset switch 16 is turned on, the capacitor 15 discharges the charged electric charges.

Then, at time Ta2(n), the frequency controller 51 outputs a control signal that instructs to "turn off" to the reset switch 16.

When the reset switch 16 receives the control signal that instructs to "turn off" from the frequency controller 51, the reset switch 16 is turned off.

When the reset switch 16 is turned off, the capacitor 15 starts to charge electric charges in accordance with a current outputted from the voltage-to-current converter 14.

At time Tb2(n), the frequency controller 51 outputs a control signal that instructs to sample the amount of charge to the ADC 18.

Time Ta2(n) and Tb2(n) may be stored in the internal memory of the frequency controller 51 or may be provided from an external source.

A period from time Ta2(n) to time Tb2(n) (constant period) is within a convergence period. In addition, the length of the period from time Ta2(n) to time Tb2(n) is the same as the length of the period from time Ta1(n) to time Tb1(n).

In the frequency controller 51, a precise convergence period is unknown, but an approximate convergence period is known upon designing, and thus, the period from time Ta2(n) to time Tb2(n) can be set within the convergence period.

When the ADC 18 receives the control signal that instructs to sample the amount of charge from the frequency controller 51, the ADC 18 samples a voltage $V_c$ applied to the capacitor 15.

The ADC 18 converts an analog value indicating the sampled voltage $V_c$ into a second digital value $V_{adc2(n)}$, and outputs the second digital value $V_{adc2(n)}$ to the computing circuit 19.

The computing circuit 19 calculates a difference between the first digital value $V_{adc1(n)}$ and second digital value $V_{adc2(n)}$ outputted from the ADC 18, as the degree of convergence C(n) of the output signal from the VCO 5, as shown in the following equation (5):

$$C(n) = V_{adc1(n)} - V_{adc2(n)} \qquad (5)$$

Here, the computing circuit 19 calculates a difference between the first digital value $V_{adc1(n)}$ and the second digital value $V_{adc2(n)}$ as the degree of convergence C(n) of the output signal from the VCO 5. However, this configuration is merely an example, and the computing circuit 19 may calculate a ratio between the first digital value $V_{adc1(n)}$ and the second digital value $V_{adc2(n)}$ as the degree of convergence C(n) of the output signal from the VCO 5, as shown in the following equation (6):

$$C(n) = V_{adc1(n)}/V_{adc2(n)} \qquad (6)$$

Figure 8:
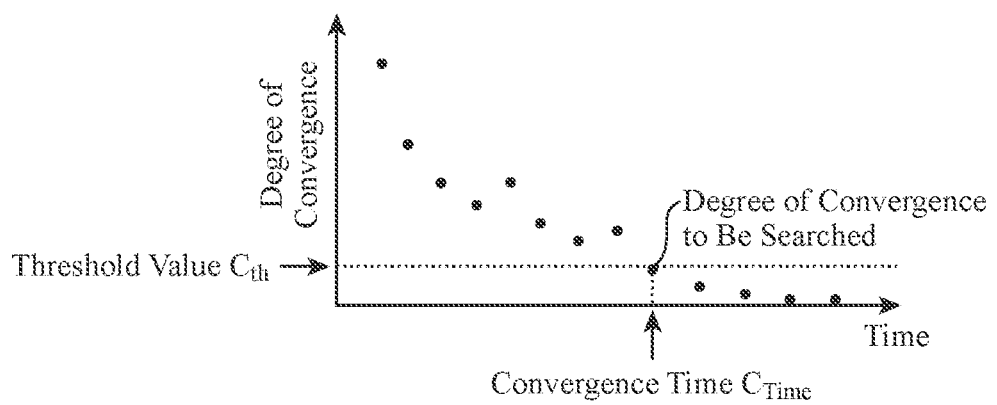
FIG. 8 is an explanatory diagram showing the degrees of convergence C(1) to C(N) calculated N times by a computing circuit 19.

FIG. 8 is an explanatory diagram showing the degrees of convergence C(1) to C(N) calculated N times by the computing circuit 19.

In FIG. 8, black dots indicate the degrees of convergence C(1) to C(N) calculated N times by the computing circuit 19. Time on a horizontal axis of FIG. 8 represents time from a time point at which the frequency of an output signal has started to abruptly decrease to time point $T_{m(n)}$.

The convergence time calculating unit 52 compares the degrees of convergence C(1) to C(N) calculated N times by the degree-of-convergence calculating circuit 17 with a threshold value $C_{th}$. The threshold value $C_{th}$ may be stored in an internal memory of the convergence time calculating unit 52 or may be provided from an external source.

The closer C(n) (n=1, 2, ..., N) is to 0, the closer the frequency of the output signal from the VCO 5 is to a desired frequency. However, when C(n) is close to the threshold value $C_{th}$, the frequency of the output signal from the VCO 5 substantially matches the desired frequency, and thus, it is conceivable that the output signal from the VCO 5 has already converged.

Hence, the convergence time calculating unit 52 searches for the degree of convergence C(n), among the degrees of convergence C(1) to C(N), that has the largest value among the degrees of convergence C(n) smaller than the threshold value $C_{th}$.

The convergence time calculating unit 52 considers that the output signal from the VCO 5 has converged at time point $T_{m(n)}$ corresponding to the searched degree of convergence C(n), and calculates time from a time point at which the frequency of the output signal has started to abruptly decrease to time point $T_{m(n)}$, as convergence time $C_{Time}$ of the output signal from the VCO 5.

In the lock detection circuit 10 of the third embodiment, the integrating circuit 11 performs each of integration of a phase difference during a constant period within a transient response period and integration of a phase difference during a constant period within a convergence period a plurality of times while switching integration periods for the phase differences, and outputs each first integration result and each second integration result to the degree-of-convergence calculating circuit 17. In addition, the degree-of-convergence calculating circuit 17 calculates each degree of convergence of an output signal from the VCO 5 from each first integration result and each second integration result which are outputted from the integrating circuit 11. Thus, the lock detection circuit 10 can calculate convergence time $C_{Time}$ of the output signal from the VCO 5.

Fourth Embodiment

In a fourth embodiment, a PLL circuit including a time period detecting unit 53 that detects a time period during which an output signal from the VCO 5 can be used, from the convergence time $C_{Time}$ calculated by the convergence time calculating unit 52 will be described.

Figure 9:
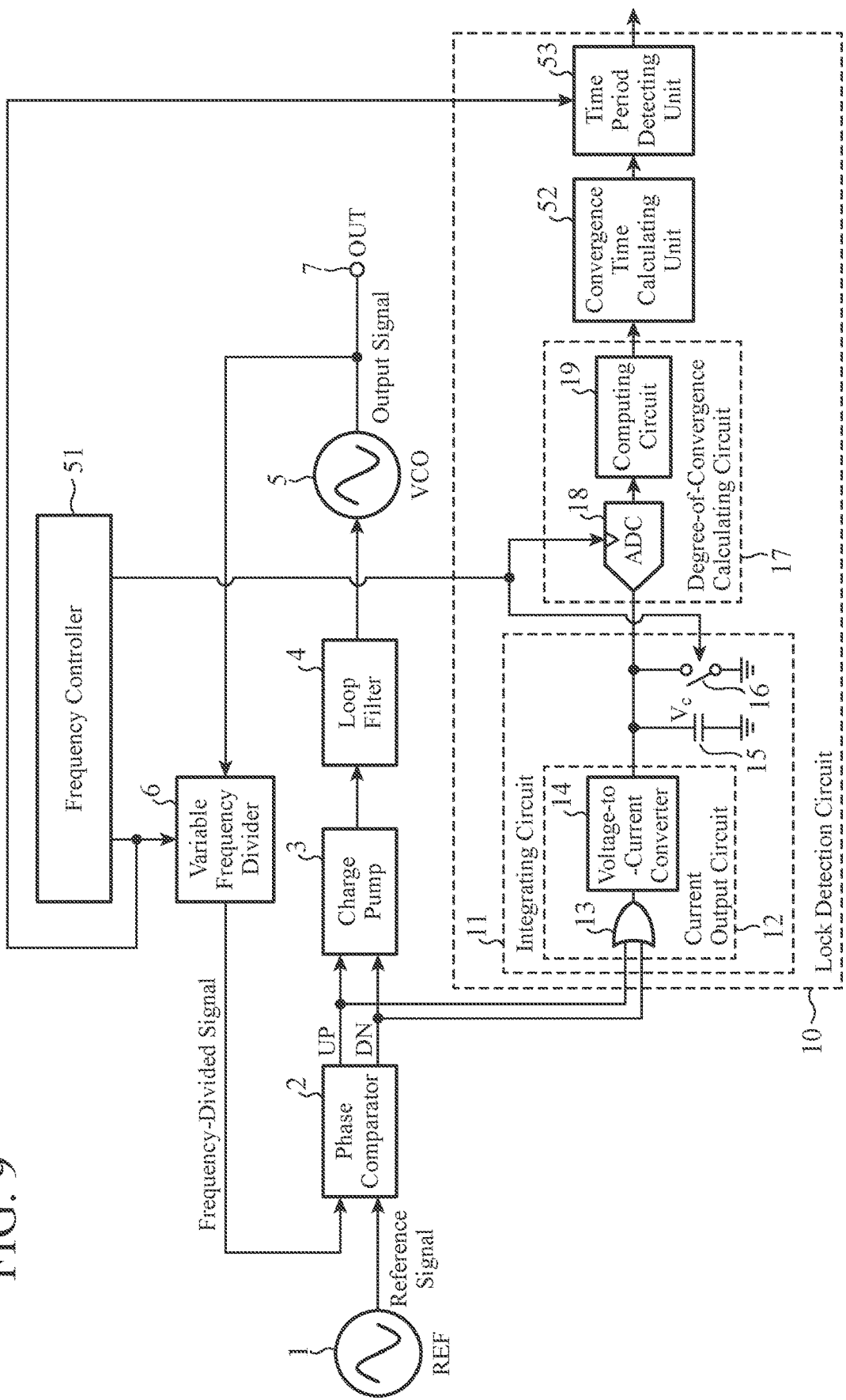
FIG. 9 is a configuration diagram showing a PLL circuit according to a fourth embodiment.

FIG. 9 is a configuration diagram showing a PLL circuit according to the fourth embodiment. In FIG. 9, the same reference signs as those of FIGS. 1, 3, and 6 indicate the same or corresponding components and thus description thereof is omitted.

The time period detecting unit 53 detects a time period during which an output signal from the VCO 5 can be used, from the convergence time $C_{Time}$ calculated by the convergence time calculating unit 52.

The PLL circuit shown in FIG. 9 is configured in such a manner that the time period detecting unit 53 is added to the PLL circuit shown in FIG. 6. However, no limitation is intended thereto, and the PLL circuit may be configured in such a manner that the convergence time calculating unit 52 and the time period detecting unit 53 are added to the PLL circuit shown in FIG. 3 and the frequency controller 51 is used instead of the frequency controller 9.

Next, the operation of the PLL circuit shown in FIG. 9 will be described. Note, however, that all components other than the time period detecting unit 53 are the same as those of the PLL circuit shown in FIG. 6, and thus, here, only operations of the time period detecting unit 53 will be described.

For example, there is a communication system (not shown) that transmits and receives a communication signal using an output signal from the VCO 5.

However, in order for the communication system to implement highly accurate transmission and reception of a communication signal, there is a need to use a converged output signal. When the communication system uses an unconverged output signal, the communication system may not be able to implement highly accurate transmission and reception of a communication signal.

In addition, there is a radar system (not shown) that performs signal processing on a radar signal, using an output signal from the VCO 5.

However, in order for the radar system to implement highly accurate signal processing, there is a need to use a converged output signal. When the radar system uses an unconverged output signal, the radar system may not be able to implement highly accurate signal processing.

Figure 10:
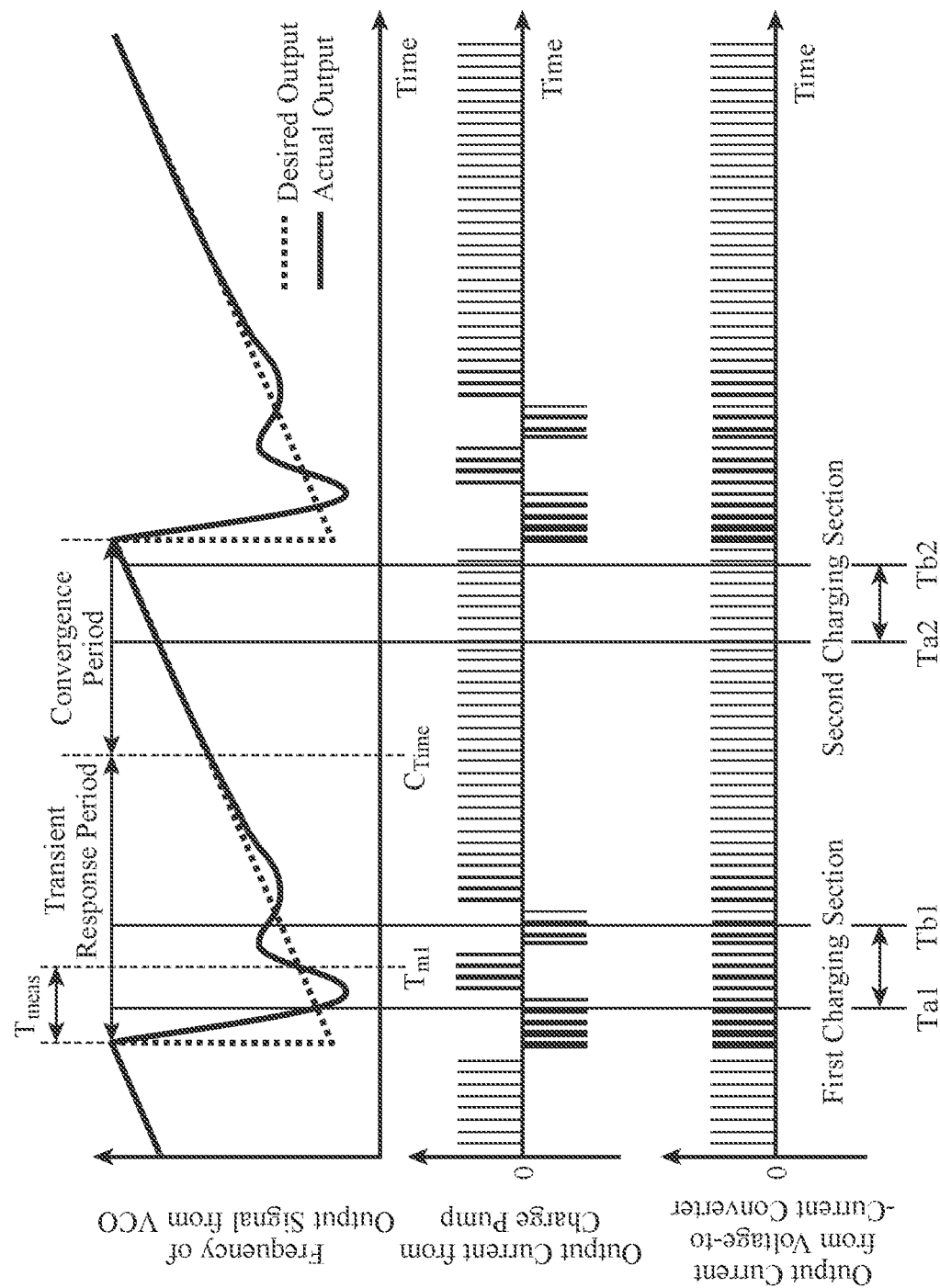
FIG. 10 is an explanatory diagram showing the frequency of an output signal from the VCO 5, a current outputted from the charge pump 3, a current outputted from the voltage-to-current converter 14, and convergence time $C_{Time}$.

As shown in FIG. 10, a portion of an output signal from the VCO 5 present during a period from the convergence time $C_{Time}$ calculated by the convergence time calculating unit 52 to a time point at which a next abrupt decrease in frequency starts is a converged output signal.

FIG. 10 is an explanatory diagram showing the frequency of an output signal from the VCO 5, a current outputted from the charge pump 3, a current outputted from the voltage-to-current converter 14, and convergence time $C_{Time}$.

The time period detecting unit 53 detects a time period from the convergence time $C_{Time}$ calculated by the convergence time calculating unit 52 to a time point at which a next abrupt decrease in the frequency of the output signal from the VCO 5 starts, as a time period during which the output signal from the VCO 5 can be used.

The time period detecting unit 53 can recognize a time point at which the frequency of the output signal from the VCO 5 starts to abruptly decrease, by monitoring a control signal indicating a division ratio and outputted to the variable frequency divider 6 from the frequency controller 51.

In the above-described fourth embodiment, the lock detection circuit 10 is configured to include the time period detecting unit 53 that detects a time period during which an output signal from the VCO 5 can be used, from the convergence time $C_{Time}$ calculated by the convergence time calculating unit 52. Thus, the lock detection circuit 10 can output a portion of the output signal from the VCO 5 present during a time period during which the output signal can be used, to a communication system, a radar system, or the like.

Fifth Embodiment

In a fifth embodiment, a PLL circuit including a convergence time adjusting circuit 54 that applies a current to an input side of the loop filter 4 so as to reduce the convergence time $C_{Time}$ calculated by the convergence time calculating unit 52 will be described.

Figure 11:
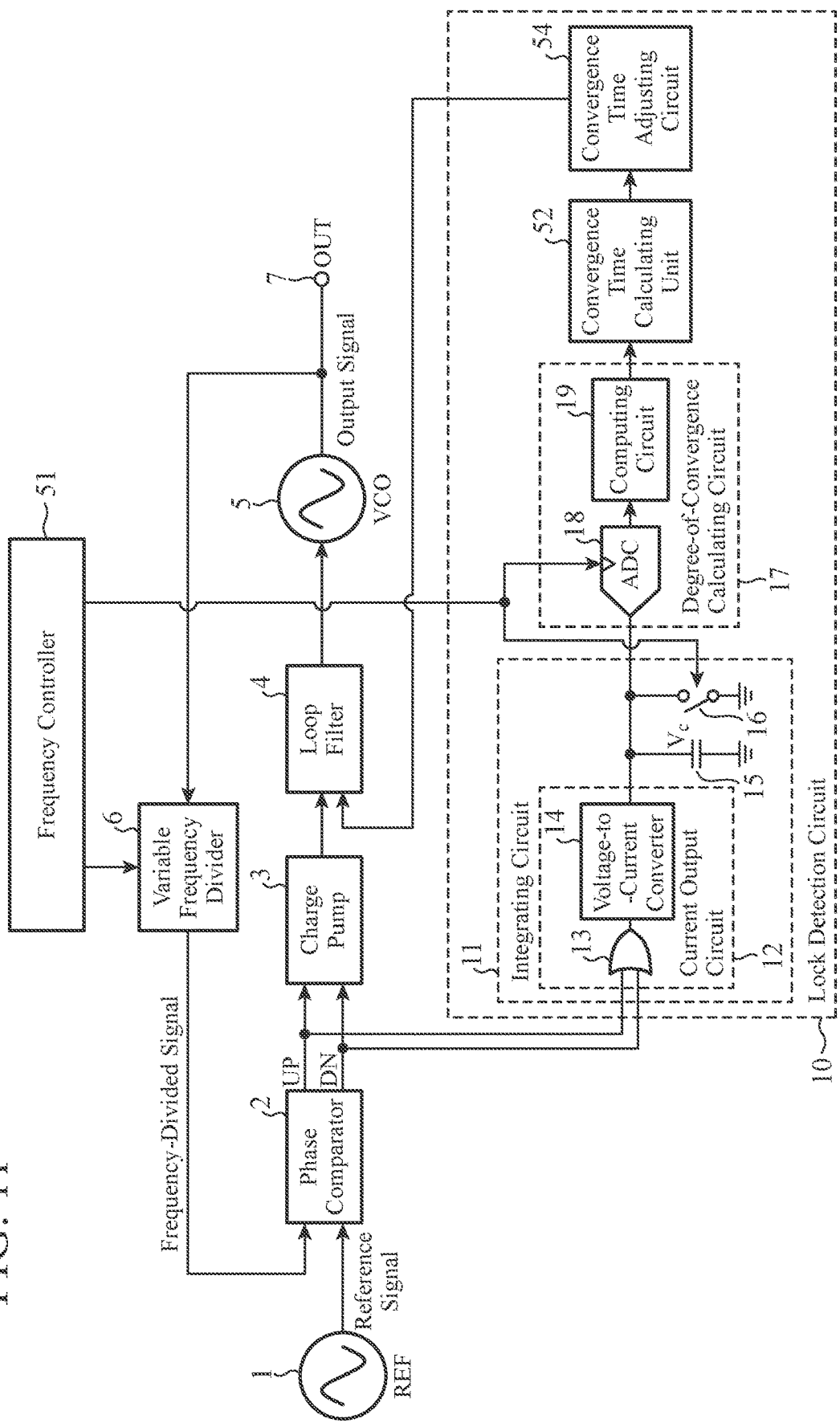
FIG. 11 is a configuration diagram showing a PLL circuit according to a fifth embodiment.

FIG. 11 is a configuration diagram showing a PLL circuit according to the fifth embodiment. In FIG. 11, the same reference signs as those of FIGS. 1, 3, 6, and 9 indicate the same or corresponding components and thus description thereof is omitted.

The convergence time adjusting circuit 54 is a circuit that applies a current to the input side of the loop filter 4 so as to reduce the convergence time $C_{Time}$ calculated by the convergence time calculating unit 52.

The PLL circuit shown in FIG. 11 is configured in such a manner that the convergence time adjusting circuit 54 is added to the PLL circuit shown in FIG. 6. However, no limitation is intended thereto, and the PLL circuit may be configured in such a manner that the convergence time calculating unit 52 and the convergence time adjusting circuit 54 are added to the PLL circuit shown in FIG. 3 and the frequency controller 51 is used instead of the frequency controller 9.

Next, the operation of the PLL circuit shown in FIG. 11 will be described. Note, however, that all components other than the convergence time adjusting circuit 54 are the same as those of the PLL circuit shown in FIG. 6, and thus, here, only operations of the convergence time adjusting circuit 54 will be described.

When the loop filter 4 receives a pulse current from the charge pump 3, as in the first embodiment, the loop filter 4 converts the pulse current into a voltage, smooths the voltage, and outputs the smoothed voltage to the VCO 5.

In this case, when, in addition to the pulse current outputted from the charge pump 3 another pulse current is inputted to the loop filter 4, the voltage outputted to the VCO 5 from the loop filter 4 changes, and thus, the convergence time $C_{Time}$ of an output signal from the VCO 5 also changes.

The convergence time adjusting circuit 54 stores the convergence time $C_{Time}$ calculated by the convergence time calculating unit 52 while changing the magnitude or polarity of a pulse current applied to the input side of the loop filter 4.

The convergence time adjusting circuit 54 identifies a pulse current, among pulse currents applied to the input side of the loop filter 4, that corresponds to the shortest convergence time $C_{Time}$ among a plurality of pieces of stored convergence time $C_{Time}$.

Thereafter, the convergence time adjusting circuit 54 applies the identified pulse current to the input side of the loop filter 4.

In the above-described fifth embodiment, the lock detection circuit 10 is configured to include the convergence time adjusting circuit 54 that applies a current to the input side of the loop filter 4 so as to reduce the convergence time $C_{Time}$ calculated by the convergence time calculating unit 52. Thus, the lock detection circuit 10 of the fifth embodiment can reduce the convergence time $C_{Time}$ over the lock detection circuits 10 of the first to fourth embodiments.

Note that in the invention of the present application, a free combination of the embodiments, modifications to any component of each embodiment, or omissions of any component in each embodiment are possible within the scope of the invention.

INDUSTRIAL APPLICABILITY

The invention is suitable for a lock detection circuit that calculates a degree at which an output signal from a phase-locked loop circuit has converged.

In addition, the invention is suitable for a phase-locked loop circuit that calculates a degree at which an output signal from a voltage-controlled oscillator has converged.

REFERENCE SIGNS LIST

1: reference signal source,
2: phase comparator,
3: charge pump,
4: loop filter,
5: VCO,
6: variable frequency divider,
7: output terminal,
8 and 9: frequency controller,
10: lock detection circuit,
11: integrating circuit,
12: current output circuit,
13: OR circuit,
14: voltage-to-current converter,
15: capacitor,
16: reset switch,
17: degree-of-convergence calculating circuit,
18: ADC,
19: computing circuit,
21: integrating circuit,
22: switched capacitor circuit,
30: capacitor,
31 to 35: switch,
41: degree-of-convergence calculating circuit,
42: ADC,
51: frequency controller,
52: convergence time calculating unit (convergence time calculator),
53: time period detecting unit (time period detector), and
54: convergence time adjusting circuit

What is claimed is:

1. A lock detection circuit comprising:
an integrating circuit to integrate a phase difference between a frequency-divided signal and a reference signal in a phase-locked loop circuit during a constant period within a transient response period for an output signal from the phase-locked loop circuit, and to integrate a phase difference between the frequency-divided signal and the reference signal during a constant period within a convergence period for the output signal from the phase-locked loop circuit; and
a degree-of-convergence calculating circuit to calculate a degree at which the output signal from the phase-locked loop circuit has converged, said degree being calculated according to a mathematical operation performed on the following operands: (1) a result of the integration of the phase difference obtained by the integrating circuit during the constant period within the transient response period, and (2) a result of the integration of the phase difference obtained by the integrating circuit during the constant period within the convergence period.

2. A lock detection circuit comprising:
an integrating circuit to integrate a phase difference between a frequency-divided signal and a reference signal in a phase-locked loop circuit during a constant period within a transient response period for an output signal from the phase-locked loop circuit, and to integrate a phase difference between the frequency-divided signal and the reference signal during a constant period within a convergence period for the output signal from the phase-locked loop circuit; and
a degree-of-convergence calculating circuit to calculate a degree at which the output signal from the phase-locked loop circuit has converged, from a result of the integration of the phase difference obtained by the integrating circuit during the constant period within the transient response period and a result of the integration of the phase difference obtained by the integrating circuit during the constant period within the convergence period,
wherein the degree-of-convergence calculating circuit calculates, as the degree at which the output signal from the phase-locked loop circuit has converged, a difference between a first integration result and a second integration result, or a ratio between the first integration result and the second integration result, the first integration result being the result of the integration of the phase difference obtained by the integrating circuit during the constant period within the transient response period and the second integration result being the result of the integration of the phase difference obtained by the integrating circuit during the constant period within the convergence period.

3. The lock detection circuit according to claim 2, wherein the integrating circuit includes:
a current output circuit to output currents indicating the phase differences between the frequency-divided signal and the reference signal; and
a capacitor to charge electric charges in accordance with a current outputted from the current output circuit, during the constant period within the transient response period, and to charge electric charges in accordance with a current outputted from the current output circuit, during the constant period within the convergence period, as integrals of the phase differences, wherein
the degree-of-convergence calculating circuit calculates, as the degree at which the output signal from the phase-locked loop circuit has converged, a difference between an amount of charge of the electric charges in the capacitor during the constant period within the transient response period and an amount of charge of the electric charges in the capacitor during the constant period within the convergence period, or a ratio between the amount of charge of the electric charges in the capacitor during the constant period within the transient response period and the amount of charge of the electric charges in the capacitor during the constant period within the convergence period.

4. The lock detection circuit according to claim 1, wherein the degree-of-convergence calculating circuit calculates, as the degree at which the output signal from the phase-locked loop circuit has converged, a difference between the result of the integration of the phase difference obtained by the integrating circuit during the constant period within the transient response period and the result of the integration of the phase difference obtained by the integrating circuit during the constant period within the convergence period.

5. The lock detection circuit according to claim 4, wherein the integrating circuit includes:
a current output circuit to output currents indicating the phase differences between the frequency-divided signal and the reference signal; and
a switched capacitor circuit to charge electric charges in a positive direction in a capacitor in accordance with a current outputted from the current output circuit, during the constant period within the transient response period, and to charge electric charges in a negative direction in the capacitor in accordance with a current outputted from the current output circuit, during the constant period within the convergence period, as integrals of the phase differences, wherein
the degree-of-convergence calculating circuit determines, as the degree at which the output signal from the phase-locked loop circuit has converged, an amount of charge of the electric charges in the capacitor having been charged in the negative direction by the switched capacitor circuit.

6. The lock detection circuit according to claim 1, wherein
the integrating circuit performs each of integration of a phase difference during a constant period within a transient response period and integration of a phase difference during a constant period within a convergence period a plurality of times while switching integration periods for the phase differences,
the degree-of-convergence calculating circuit calculates each degree at which the output signal from the phase-locked loop circuit has converged, from each result of the integration of the phase difference obtained by the integrating circuit during the constant period within the transient response period and each result of the integration of the phase difference obtained by the integrating circuit during the constant period within the convergence period, and
the lock detection circuit comprises a convergence time calculator to calculate convergence time of the output signal from the phase-locked loop circuit from each degree at which the output signal has converged, the each degree being calculated by the degree-of-convergence calculating circuit.

7. The lock detection circuit according to claim 6, comprising a time period detector to detect a time period during which the output signal from the phase-locked loop circuit can be used, from the convergence time calculated by the convergence time calculator.

8. The lock detection circuit according to claim 6, comprising a convergence time adjusting circuit to apply a current to an input side of a loop filter included in the phase-locked loop circuit, so as to reduce the convergence time calculated by the convergence time calculator.

9. A phase-locked loop circuit comprising:
a reference signal source to output a reference signal;
a phase comparator to output a phase difference between the reference signal outputted from the reference signal source and a frequency-divided signal;
a voltage-controlled oscillator whose output signal frequency changes in accordance with the phase difference outputted from the phase comparator;
a variable frequency divider to divide a frequency of an output signal from the voltage-controlled oscillator and to output the frequency-divided output signal as the frequency-divided signal to the phase comparator;
an integrating circuit to integrate a phase difference outputted from the phase comparator, during a constant period within a transient response period for the output signal from the voltage-controlled oscillator, and integrating a phase difference outputted from the phase comparator, during a constant period within a convergence period for the output signal from the voltage-controlled oscillator; and
a degree-of-convergence calculating circuit to calculate a degree at which the output signal from the voltage-controlled oscillator has converged, said degree being calculated according to a mathematical operation performed on the following operands: (1) a result of the integration of the phase difference obtained by the integrating circuit during the constant period within the transient response period, and (2) a result of the integration of the phase difference obtained by the integrating circuit during the constant period within the convergence period.

* * * * *